United States Patent [19]
Allen et al.

[11] Patent Number: 5,250,395
[45] Date of Patent: Oct. 5, 1993

[54] PROCESS FOR IMAGING OF PHOTORESIST INCLUDING TREATMENT OF THE PHOTORESIST WITH AN ORGANOMETALLIC COMPOUND

[75] Inventors: Robert D. Allen; Scott A. MacDonald, both of San Jose; Dennis R. McKean, Cupertino, all of Calif.; Hubert Schlosser, Glashütten, Fed. Rep. of Germany; Robert J. Twieg, San Jose, Calif.; Gregory M. Wallraff, Morgan Hill, Calif.; Carlton G. Willson, San Jose, Calif.

[73] Assignee: International Business Machines Corporation, Armonk, N.Y.

[21] Appl. No.: 735,420

[22] Filed: Jul. 25, 1991

[51] Int. Cl.$^5$ .................... G03C 5/16; G03C 1/72
[52] U.S. Cl. .................... 430/325; 430/270; 430/330; 430/313; 156/643
[58] Field of Search ........... 430/270, 311, 313, 322, 430/325, 330, 331; 156/643

[56] References Cited

U.S. PATENT DOCUMENTS

| | | | |
|---|---|---|---|
| 4,245,029 | 1/1981 | Crivello | 430/280 |
| 4,478,932 | 10/1984 | Keane et al. | 430/314 |
| 4,491,628 | 1/1985 | Ito et al. | 430/176 |
| 4,552,833 | 11/1985 | Ito | 430/325 |
| 4,552,833 | 11/1985 | Ito et al. | 430/325 |
| 4,613,398 | 9/1986 | Chiong | 430/313 |
| 4,657,845 | 4/1987 | Fretchet et al. | 430/326 |
| 4,665,006 | 5/1987 | Sachdev et al. | 430/270 |
| 4,756,988 | 7/1988 | Ai et al. | 430/272 |
| 4,756,989 | 7/1988 | Ai | 430/272 |
| 4,800,152 | 1/1989 | Allen et al. | 430/270 |
| 4,810,601 | 3/1989 | Allen et al. | 430/18 |
| 4,837,124 | 6/1989 | Wu et al. | 430/270 |
| 4,902,770 | 2/1970 | Ishii et al. | 528/149 |

OTHER PUBLICATIONS

Willson, C. G. et al., "Microlithography Introduction: Resist Materials and Their Processing", SPIE-The International Society for Optical Engineering, Short Course Notes, pp. 166-171, Mar. 3, 1991.

Taylor, G. N. et al., "Gas-Phase-Functionalized Plasma-Developed Resists: Initial Concepts and Results for Electron-Beam Exposure", J. Electrochem. Soc., 131(7) 13, p. 1658, 1984.

Coopmans, F. et al., "Desire: A Novel Dry Developed Resist System", SPIE, vol. 631, Advances in Resist Technology and Processing III (1986).

MacDonald, S. et al., "A Single-Layer, Multilevrl Resist: Limited-Penetration Electron-Beam Lithography", CCS, Symp. Ser. 346, 1987.

Allen, et al., "A One-Layer Multilayer Resist", ACS Symp., Ser. 346, 1987, 101.

Schellekens et al., "Single Level Dry Developable Resist Systems, Based On Gas Phase Silvation", SPIE vol. 1086, Advances in Resist Technology and Processes VI 1989.

Yang et al., "Top-Imaged Single-Layer Resist Process", J. Vac. Sci. Technol. B7(6), Nov./Dec. 1989.

Ito et al., "Positive/Negative Mid UV Resists with High Thermal Stability", SPIE-The International Society for Optical Engineering, Advances in Resist Technology and Processing IV, vol. 771, pp. 24-31, Mar. 2, 1987.

Primary Examiner—Marion E. McCamish
Assistant Examiner—Kathleen Duda
Attorney, Agent, or Firm—Robert B. Martin

[57] ABSTRACT

The present invention relates to a process for negative tone imaging of photoresist to improve resolution of lithographic patterns.

8 Claims, 1 Drawing Sheet

ND TREATMENT OF THE
PROCESS FOR IMAGING OF PHOTORESIST INCLUDING TREATMENT OF THE PHOTORESIST WITH AN ORGANOMETALLIC COMPOUND

FIELD OF THE INVENTION

The present invention relates to a process for imaging of photoresist to improve resolution of lithographic patterns.

BACKGROUND OF THE INVENTION

There is a desire in the industry for higher circuit density in microelectronic devices which are made using lithographic techniques. One method of achieving higher circuit density is to improve the resolution of the lithographic patterns made in the photoresist film.

Radiation backscattering during exposure caused by reflections from the topographical features of the substrate are a significant contribution to linewidth variation and resolution problems.

A prior art technique for improving the resolution of lithographic patterns in photoresist involves forming multilayered resists. A thick polymer layer is first coated on the substrate over the surface topography to provide a planar surface upon which a thin imaging resist layer is uniformly coated. After the imaging layer is imagewise exposed to radiation, it is used as a blanket exposure or etch mask to delineate the planarizing layer. The image is developed from the imaging layer through the planarizing layer to the substrate. Although, multilayered resists substantially solve the problems caused by radiation backscattering from the substrate, they require additional processing steps resulting in increased process complexity and cost.

Allen et al., U.S. Pat. No. 4,810,601, issued Mar. 7, 1989, discloses a method of avoiding image distortion resulting from backscattering by adjusting the energy and length of exposure of an electron beam source to confine the beam to the top portion of the photoresist.

While such a process is suitable in those limited situations which are appropriate for electron beam exposure, there still is a need in the art for a method for avoiding image distortion resulting from backscattering for use with other types of radiation exposures such as ultraviolet/visible electromagnetic radiation exposure.

It is therefore an object of the present invention to provide a novel method for imaging of a photoresist.

Other objects and advantages will become apparent from the following disclosure.

SUMMARY OF THE INVENTION

The present invention relates to a process for generating a negative tone resist image on a substrate comprising the steps of:
(a) coating the substrate with a film comprising (i) a polymer having pendant groups with masked reactive functionality and (ii) an effective amount of an aromatic dye to absorb substantially all imaging ultraviolet/visible electromagnetic radiation incident on the film during said process before it hits said substrate;
(b) imagewise exposing the film to the imaging ultraviolet/visible electromagnetic radiation to cause unmasking of the reactive functionality in the exposed portion of the film;
(c) contacting said film with an organometallic compound to form an etch barrier with said reactive functionality and
(d) etching the film with reactive ions to yield development in the dry state.

In the preferred embodiment of the present invention, the reactive functionality is masked by an acid labile protecting group. In the preferred embodiment, the film also comprises a photoacid generator which generates free acid upon exposure to the imaging electromagnetic radiation. The free acid unmasks the acid labile protecting group to liberate the reactive functionality.

In an alternative embodiment of the present invention, the aromatic dye is covalently bonded to the polymer.

DETAILED DESCRIPTION OF THE INVENTION

Figure 1:
FIGS. 1-2 are photographs of negative tone resists images made according to the process of the present invention.

The present invention relates to a process for generating a negative tone resist image on a substrate comprising the steps of:
(a) coating the substrate with a film comprising (i) a polymer having pendant groups with masked reactive functionality and (ii) an effective amount of an aromatic dye to absorb substantially all imaging electromagnetic radiation incident on the film during said process before it hits said substrate;
(b) imagewise exposing the film to imaging electromagnetic radiation having a wavelength of from about 200 nm to about 500 nm to cause unmasking of the reactive functionality in the exposed portion of the film;
(c) contacting said film with an organometallic compound to form an etch barrier with said reactive functionality; and
(d) etching the film with reactive ions to yield development in the dry state.

A preferred embodiment of the process of the present invention relates to a process for generating a negative tone resist image on substrate comprising the steps of:
(a) coating the substrate with a film comprising (i) a photoacid generator; (ii) a polymer having pendant groups with acid labile masked reactive functionality and (iii) an effective amount of aromatic dye to absorb substantially all imaging electromagnetic radiation incident on the film during said process before it hits said substrate;
(b) imagewise exposing the film to imaging electromagnetic radiation having a wavelength of from about 200 nm to about 500 nm to generate free acid which causes unmasking of the reactive functionality in the exposed portion of the film;
(c) heating the film to an elevated temperature;
(d) contacting said film with an organometallic compound to form an etch barrier with said reactive functionality and
(e) etching the film with reactive ions to yield development in the dry state.

In the first step of the process of the present invention, a suitable substrate such as silicon, silicon oxide, silicon nitride or gallium arsenide is coated with a film comprising the polymer and an aromatic dye both dissolved in a suitable organic solvent.

The polymer has pendant groups with masked reactive functionality. A variety of suitable polymer backbones with and without aromatic substituents can be utilized to carry the pendant groups and such polymer backbones will be known to those skilled in the art.

The polymer has pendant groups with masked reactive functionalities. The exposure of the polymer to electromagnetic radiation results in the unmasking of the reactive functionality. Suitable unmasked reactive functionalities include groups such as —COOH, —OH, —NH$_2$, and —SH. These groups can react with organometallic compounds to form materials which are resistant to reactive ion etching.

In one embodiment, the masking group is directly removed by exposure to radiation. Examples of materials with this type of masked reactive functionality are poly(p-formyloxystyrene) and copolymers thereof prepared from p-formyloxystyrene. Other types of this kind of masked reactive functionality will be known to those skilled in the art.

In another embodiment the reactive functionality is masked by an acid labile protection group such as t-butyl esters or carbonates. In this embodiment, the film also comprises a photoacid generator which generates free acid upon exposure to imaging electromagnetic radiation. The free acid removes the acid labile protecting group. The unmasked reactive functionality can then react with an organometallic compound to form an etch barrier. Suitable polymers having reactive functionalities masked by an acid labile protecting groups are poly(t-butyl methacrylate) and its copolymers and poly(t-butyloxycarbonyloxystyrene) and its copolymers. Other polymers with masked reactive functionalities will be known to those skilled in the art such as those disclosed in U.S. Pat. Nos. 4,810,601, and 4,552,833 the disclosures of which are incorporated herein by reference.

Suitable photoacid generators for use in the present invention are onium salts. Suitable onium salts include unsubstituted and symmetrically or unsymmetrically substituted diaryliodium, triaylsulfonium, triarylselenonium, and substituted aryldiazonium salts of the conjugate bases of strong acids. Suitable specific photoacid generators are triphenylsulfonium hexafluoroarsenate and diphenyliodonium arsenate. Other suitable photoacid generators will be known to those skilled in the art.

The film also comprises an aromatic dye. The dye functions to absorb substantially all imaging ultraviolet/visible electromagnetic radiation incident on the film during the process before it hits the substrate. The imaging ultraviolet/visible electromagnetic radiation used in the process of the present invention preferably has a wavelength of from about 200 to about 500 nm. In some cases, the radiation will be mono or dichromatic with the wavelength(s) being particularly effective in unmasking the reactive functionality. The dye functions to absorb substantially all of this imaging radiation in the film (greater than about 95%) before it hits the substrate to prevent backscattering with the accompanying linewidth and resolution problems.

Suitable classes of dyes are aromatic compounds and other compounds having large aborption coefficients at the imaging wavelength. Suitable classes of dyes include fluorenes, nitrostilbenes, biphenyls, furans and anthracenes and derivatives thereof. Suitable dyes include alkoxynitrostilbene e.g. 2,5-dimethoxy-4-nitrostilbene and phenoxymethylene anthracene. The optimum dye will generally have a large absorption coefficient at the wavelength(s) of the imaging electromagnetic radiation. Further the dye will be soluble in the organic solvent used to coat the film onto the substrate. The dye should be sufficiently soluble in the solvent/resist mixture so that high absorption is obtained for the resist film. The dye should not interfere with the process of the present invention nor adversely effect the final properties of the resist. The dye can also function as a photosensitizer for the photoacid generator.

The polymer and dye are generally dissolved in a suitable organic solvent, the solution suitably containing about 20 weight % of the polymer and dye. Suitable organic solvents include methyl cellosolve acetate, cyclohexanone, propylene glycol monomethyl ether acetate, and ethyl lactate. The film will generally comprise about 85 to about 95 weight % of the polymer and about 5 to about 15 weight % of the dye both dissolved in the organic solvent. The film can be coated on the substrate using art known techniques such as spin or spray coating, or doctor blading.

Optionally the dye molecule can be covalently bonded to the polymer. Examples of such embodiment are a copolymer of t-butylmethacrylate and 9-anthracenylmethyl methacrylate, a copolymer of t-butyloxycarbonyloxystyrene and 9-anthracenylmethyl methacrylate, and copolymer of t-butyloxycarbonyloxy styrene and vinyl biphenyl. Other types of polymers containing the dye can be synthesized by those skilled in the art for use in the process of the present invention.

In the second step of the process of the present invention, the film is imagewise exposed to imaging ultraviolet/visible electromagnetic radiation to cause unmasking of the reactive functionality in the exposed region of the film. Suitable radiation sources include various arc lamps as mercury, deuterium or excimer laser source.

In the third step of the process of the present invention, the film is preferably heated to an elevated temperature of about 80° C. to about 120° C. for a short period of time from about 1 to 2 minutes. The heating facilitates the unmasking of the reactive functionality.

In the fourth step of the process of the present invention, the film is contacted with an organometallic compound disposed in the gas phase or in solution. Preferred metallic portions of the organometallic compound comprises silicon, tin, germanium and titanium. Preferred organometallic compounds are organosilicon and organostannyl compounds including, for example, dimethylaminotrimethylsilane, hexamethyldisilazane, trimethylsilyl chloride, trimethyl stannyl chloride, dimethyl stannyl chloride, and 1,1,3,3,5,5 hexamethylcyclotrisilazane. Other organometallic compounds will be known to those skilled in the art.

The unmasked reactive functionalities in the exposed portion of the film will react with the organometallic compound to form a material which is resistant to reactive ion etching. The masked reactive funtionalities in the unexposed portion of the film do not react with the organometallic compound and these portions of the film are susceptible to reactive ion etching.

The last step of the process of the present invention involves etching the film with reactive ions to yield development in the dry state. Development results in exposure of the substrate in the unexposed portion of the film. As used herein etching with reactive ions will include plasma etching and reactive ion etching. Suitable gases for use in the process of the present invention include oxygen, carbon tetrafluoride, sulfur hexafluoride and mixtures thereof. Etching techniques are well known in the art and equipment is commercially available to etch films in the dry state.

The present invention also relates to an integrated circuit comprising a circuit made by the steps of:

(a) coating the substrate with a film comprising (i) a polymer having pendant groups with masked reactive functionality and (ii) an effective amount of an aromatic dye to absorb substantially all imaging electromagnetic radiation incident on the film during said process before it hits said substrate;

(b) imagewise exposing and film to imaging electromagnetic radiation having a wavelength of from about 200 nm to about 500 nm to cause unmasking of the reactive functionality in the exposed portion of the film;

(c) contacting said film with an organometallic compound to form an etch barrier with said reactive functionality;

(d) etching the film with reactive ions to yield development in the dry state, and (e) forming the circuit in the developed film on the substrate by art known techniques.

Preferably, the integrated circuit is formed in a process where the reactive functionality is masked by an acid labile protecting group.

After the substrate has been exposed by development, circuit patterns can be formed in the exposed areas by coating the substrate with a conductive material such as conductive metals by art known techniques such as evaporation, sputtering, chemical vapor deposition or laser induced deposition. Dielectric materials may also be deposited by similar means during the process of making circuits. Inorganic ions such as boron, phosphorous or arsenic can be implanted in the substrate in the process for making p or n doped circuit transistors. Other means for forming circuits will be known by those skilled in the art.

The following examples are detailed descriptions of methods of preparation and use of the process of the present invention. The detailed preparations fall within the scope of, and serve to exemplify, the more generally described methods set forth above. The examples are presented for illustrative purposes only, and are not intended as a restriction on the scope of the invention. All temperatures are in degrees Celsius.

EXAMPLE I 0.53 g of phenoxymethyleneanthracene and 0.20 g of triphenylsulfonium hexafluoroarsenate were added to 20 g of a 24 weight % solution of poly (t-butyloxycarbonyloxystyrene) in propylene glycol monomethyl ether acetate, ("PMA"). This mixture was diluted with 7 g of PMA and spin coated at 4000 RPM onto a silicon wafer to form a 1.1μ thick film. The film was baked on a hot plate for 5 minutes at 90° C. and exposed to 10–20 millijoules/cm$^2$ of 248 nm radiation (KrF excimer laser). Immediately after the exposure the wafers were baked at 90° C. for 90 seconds. The wafers were placed into a modified vacuum oven and the system was evacuated. The wafers were silylated for 10 minutes at 100° and 100 torr with dimethylaminotrimethylsilane. The silylated wafers were transferred for O$_2$ RIE development. The specific etching conditions were: 40 SCCM O$_2$; 20 mtorr; 150 Watt RF power; DC bias, −270 volts; graphite electrode; etch time, 10 to 12 minutes. Some of the processed wafers were dipped into dilute buffered HF for a few seconds to remove substrate residue. Four of the wafers were analyzed using Rutherford Backscattering analysis to show the depth of penetration of the silicon into the film. The data was as follows:

| Wafer | Film Thickness* | Si depth* |
|---|---|---|
| 1 | 0.99 | 0.19 |
| 2 | 0.91 | 0.24 |
| 3 | 1.01 | 0.38 |
| 4 | 0.88 | 0.27 |

*in microns

EXAMPLE II

A copolymer comprising 86% of t-butylmethacrylate and 14% of 9-anthracenylmethylmethacrylate was prepared by conventional radical polymerization. This polymer was formulated with 3 mole % of triphenylsulfonium hexafluoroarsenate (based on ester content) in cyclohexanone solvent.

This formulation was spin coated onto silicon wafers, baked at 90° for 4 minutes, exposed to 248 nm light, and then baked at 100° for 1 minute. The imaged wafer was treated with Me$_2$N-SiMe$_3$ for 5 minutes at 200 torr and 100° C. Finally the image was dry developed in an oxygen plasma environment using conditions described in Example 1. Rutherford Backscattering analysis on the film (about 1 micron thick) showed that the silicon penetrated about 20% of the depth of the film.

EXAMPLE III

A copolymer comprising about 84% t-butyloxycarbonyloxystyrene and 16% 9-anthracenylmethylmethacrylate was prepared by conventional radical polymerization.

This polymer was formulated with 3 mole % of triphenylsulfonium hexafluoroarsenate (based on ester content) in cyclohexanone solvent. This formulation was spin coated onto silicon wafers, baked at 90° for 4 minutes, exposed to light, and then baked at 100° for 1 minutes. The imaged wafer was treated with Me$_2$N-SiMe$_3$ for 5 minutes at 200 torr and 100° C. Finally the image was dry developed in an oxygen plasma environment using conditions described in Example 1. Rutherford Backscattering analysis on the film (about 1 micron thick) showed that the silicon penetrated about 50% of the depth of the film.

EXAMPLE IV

A copolymer comprising 75% (t-butoxyoxycarbonyloxy styrene) and 25% vinyl biphenyl was prepared by conventional free radical polymerization. This polymer was formulated with 4% of triphenyl sulfonium hexafluoroarsentate and dissolved in propylene glycol methyl ether acetate to produce a 20% solution. The absorbance at 248 nm of a 0.95 um film of this resist composition was 2.2. This resist was exposed on a 248 nm excimer laser stepper (~20 mJ/cm$^2$). The resist was processed as above. FIG. 1 shows high resolution images printed over reflective aluminum topography without linewidth variation which demonstrates the surface-imaging benefits of this resist.

Figure 2:
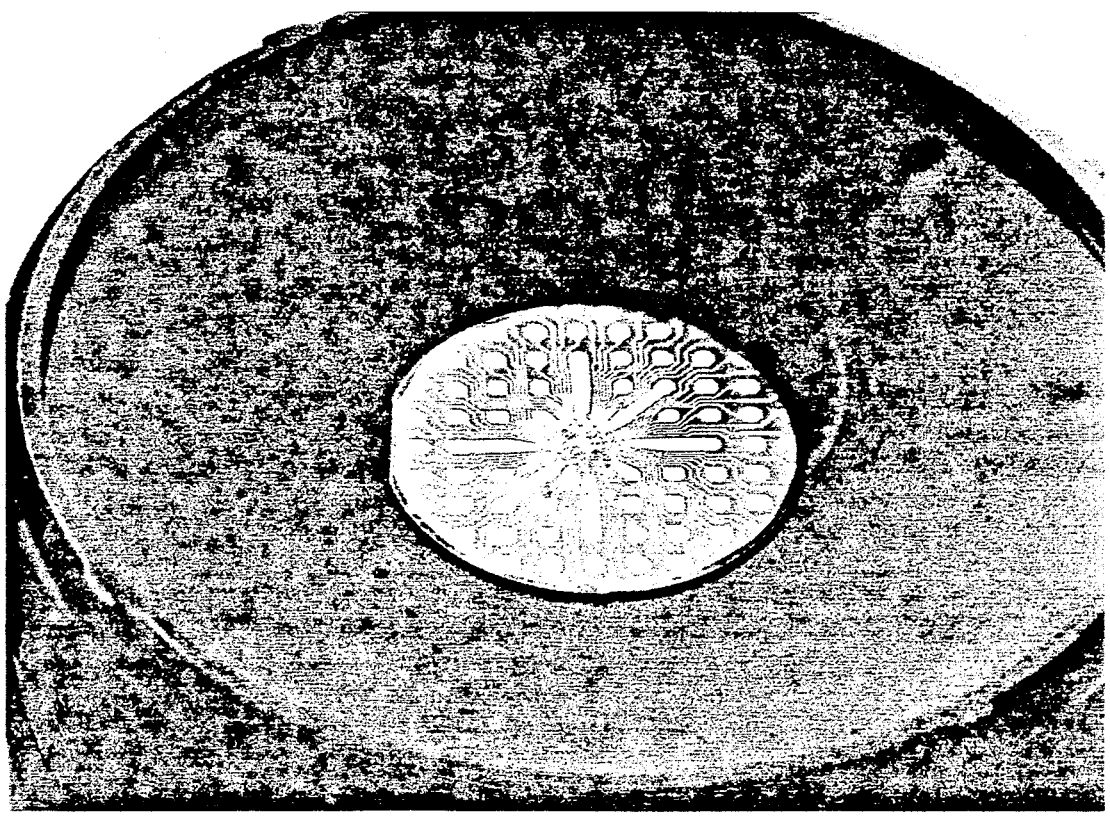

EXAMPLE V 2.0 g of 20% (by wt) of poly (t-butyloxycarbonyloxystyrene) in cyclohexanone was admixed with 220 mg of Ph$_2$ISbF$_6$ and 100 mg of diphenylisobenzylfuran and spin coated on silicon substrate to form 2.2 μm film. The absorbance of this film at 436 nm was greater than 2. The film was baked at 90° C. for 60 sec, exposed at 436 nm with 160 mJ/cm$^2$ and baked at 110° C., for 180 sec. IR spectra shows that only 14% of the carbonate groups have been removed. The film was then silylated with 100 torr of M$_2$N-SiMe$_3$ for 300 seconds. The film was developed with oxygen plasma (1 KW Rf, 1 mtorr, 10 sccm O$_2$ for 82 sec) to give the resist image shown in FIG. 2.

Although this invention has been described with respect to specific embodiments, the details thereof are not to be construed as limitations for it will be apparent that various embodiments, changes and modifications may be resorted to without departing from the spirit and scope thereof, and it is understood that such equivalent embodiments are intended to be included within the scope of this invention.

We claim:

1. A process for generating a negative tone resist image on substrate comprising the steps of:
   (a) coating the substrate with a film comprising (i) a polymer having pendant groups with masked reactive functionality and (ii) an effective amount of an aromatic dye to absorb substantially all imaging electromagnetic radiation incident on the film during said process before it hits said substrate;
   (b) imagewise exposing the film to imaging electromagnetic radiation having a wavelength of from about 200 nm to about 500 nm to cause unmasking of the reactive functionality in the exposed portion of the film;
   (c) contacting said film with an organometallic compound to form an etch barrier with said reactive functionality; and
   (d) etching the film with reactive ions to yield development in the dry state.

2. The process of claim 1 wherein said aromatic dye is a nitrostilbene, an anthracene or a biphenyl.

3. A process for generating a negative tone resist image on substrate comprising the steps of:
   (a) coating the substrate with a film comprising (i) a photoacid generator; (ii) a polymer having pendant groups with acid labile masked reactive functionality and (iii) an effective amount of aromatic dye to absorb substantially all imaging electromagnetic radiation incident on the film during said process before it hits said substrate;
   (b) imagewise exposing the film to imaging electromagnetic radiation having a wavelength of from about 200 nm to about 500 nm to generate free acid which causes unmasking of the reactive functionality in the exposed portion of the film;
   (c) heating the film to an elevated temperature;
   (d) contacting said film with an organometallic compound to form an etch barrier with said reactive functionality and
   (e) etching the film with reactive ions to yield development in the dry state.

4. The process claim 3 wherein said masked reactive functionality is a carbonate or a t-butyl ester.

5. The process of claim 3 wherein said aromatic dye is a nitrostilbene, an anthracene or a biphenyl.

6. The process of claim 3 wherein said polymer is poly(t-butyloxycarbonyloxystyrene).

7. The process of claim 3 wherein said polymer is a copolymer of t-butyloxycarbonyloxystyrene and 9-anthracenylmethylmethacrylate.

8. The process of claim 3 wherein said organometallic compound is an organosilicon compound.

* * * * *